United States Patent
Carroll et al.

(10) Patent No.: US 9,484,973 B1
(45) Date of Patent: Nov. 1, 2016

(54) VOLTAGE EQUALIZATION FOR STACKED FETS IN RF SWITCHES

(75) Inventors: Michael Carroll, Jamestown, NC (US); Daniel Charles Kerr, Oak Ridge, NC (US); Ali Tombak, High Point, NC (US); Philip Mason, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 1320 days.

(21) Appl. No.: 12/944,212

(22) Filed: Nov. 11, 2010

Related U.S. Application Data

(60) Provisional application No. 61/371,809, filed on Aug. 9, 2010.

(51) Int. Cl.
*H04B 1/28* (2006.01)
*H04B 1/52* (2015.01)

(52) U.S. Cl.
CPC . *H04B 1/28* (2013.01); *H04B 1/52* (2013.01)

(58) Field of Classification Search
CPC ........ H04B 1/525; H04B 1/406; H04B 1/18; H04B 1/48; H04B 1/44; H04B 1/52; H04B 1/28; H01J 17/04
USPC ........ 455/333, 83, 79; 257/27, 69, 124, 133, 257/296
See application file for complete search history.

(56) References Cited

U.S. PATENT DOCUMENTS

| | | | | |
|---|---|---|---|---|
| 5,796,334 A * | 8/1998 | Chen | ....................... | G06K 1/128 307/10.7 |
| 6,326,822 B1 * | 12/2001 | Yoon | .................. | H03K 19/0013 326/87 |
| 6,804,502 B2 * | 10/2004 | Burgener | .................. | H01P 1/15 257/341 |
| 6,882,829 B2 * | 4/2005 | Mostov | .................... | H04B 1/48 455/78 |
| 7,071,799 B2 * | 7/2006 | Behzad | ................ | H03D 7/1441 334/47 |
| 7,518,458 B2 * | 4/2009 | Nakamura | ............. | H03D 3/007 331/167 |
| 7,772,648 B1 * | 8/2010 | Ivanov | ................ | H01L 27/1203 257/347 |
| 8,131,225 B2 * | 3/2012 | Botula | ................ | H01L 27/1203 257/349 |
| 8,536,636 B2 * | 9/2013 | Englekirk | ............ | H03K 17/102 257/303 |
| 2001/0040479 A1* | 11/2001 | Zhang | .................. | H03K 17/687 327/427 |
| 2002/0102971 A1* | 8/2002 | Jayaraman | ............ | H03F 1/0205 455/127.2 |
| 2003/0223261 A1* | 12/2003 | Kato | ...................... | G11C 7/065 365/63 |

(Continued)

OTHER PUBLICATIONS

Monolithic FET structures for HP control component application. Mitchell B Shifrin. vol. 37. No. 12. Dec. 1989.*

(Continued)

*Primary Examiner* — Md Talukder
(74) *Attorney, Agent, or Firm* — Withrow & Terranova, P.L.L.C.

(57) ABSTRACT

A switch branch that improves voltage uniformity across a series stack of an n-number of transistors is disclosed. A first one of the n-number of transistors is coupled to an input terminal, and an nth one of the n-number of transistors is coupled to an output terminal, where n is a positive integer greater than one. Predetermined parasitic capacitances associated with each of the n-number of transistors are adjustable with respect to capacitance value by predetermined amounts by dimensioning and arranging at least one metal layer element in proximity to the series stack of the n-number of transistors. Capacitance values for the predetermined parasitic capacitances are selected such that a voltage across the series stack of the n-number of transistors is uniformly distributed. In this way, the n-number of transistors can be reduced without risking a transistor breakdown within the series stack of the n-number of transistors.

24 Claims, 12 Drawing Sheets

(56) References Cited

U.S. PATENT DOCUMENTS

| | | | | |
|---|---|---|---|---|
| 2004/0077327 | A1* | 4/2004 | Lim | H03B 5/366 455/318 |
| 2004/0174730 | A1* | 9/2004 | Takashima | G11C 11/22 365/145 |
| 2006/0208833 | A1* | 9/2006 | Sung | H03H 3/02 333/189 |
| 2007/0018247 | A1* | 1/2007 | Brindle | H01L 29/78609 257/347 |
| 2007/0024272 | A1* | 2/2007 | Zentai | G01R 31/2812 324/763.01 |
| 2007/0254446 | A1* | 11/2007 | Pellizzer | H01L 21/8249 438/309 |
| 2008/0117894 | A1* | 5/2008 | McMorrow | H03F 3/217 370/359 |
| 2009/0097281 | A1* | 4/2009 | Lin | H02M 3/33569 363/21.18 |
| 2009/0172242 | A1* | 7/2009 | Piasecki | G06F 13/4208 710/317 |
| 2010/0125989 | A1* | 5/2010 | Huang | H01G 4/33 29/25.42 |
| 2010/0200898 | A1* | 8/2010 | Lin | H01L 27/14618 257/294 |
| 2010/0244263 | A1* | 9/2010 | Lin | H01L 23/5227 257/758 |
| 2011/0001543 | A1* | 1/2011 | Kondo | H01L 27/0207 327/419 |
| 2011/0068414 | A1* | 3/2011 | Anderson | H01L 29/66795 257/401 |
| 2011/0214910 | A1* | 9/2011 | Eldridge | H05K 3/4647 174/258 |
| 2011/0227569 | A1* | 9/2011 | Cai | B82Y 25/00 324/252 |
| 2012/0139363 | A1* | 6/2012 | Kerr | H04B 1/006 307/115 |
| 2012/0268205 | A1* | 10/2012 | Presti | H03F 1/223 330/253 |

OTHER PUBLICATIONS

Shifrin, M.B. et al, "Monolithic FET structures for high-power control component applications," IEEE Transactions on Microwave Theory and Techniques, Dec. 1989, pp. 2134-2141, vol. 37, No. 12, IEEE.

* cited by examiner

| DEVICE | ML1 WIDTH | ML2 WIDTH | JUNCT CAP | M1 CAP | M2 CAP | FET CAP | ADDITIONAL CAP | TOTAL CAP |
|---|---|---|---|---|---|---|---|---|
| | um | um | fF/mm | fF/mm | fF/mm | fF/mm | fF/mm | fF/mm |
| M1 | 0.58 | 0.56 | 156 | 79.4 | 114.1 | 195.7 | 153.8 | 349.5 |
| M2 | 0.5 | 0.5 | 156 | 60.7 | 94.0 | 195.7 | 115.0 | 310.7 |
| M3 | 0.46 | 0.44 | 156 | 54.3 | 79.9 | 195.7 | 94.5 | 290.2 |
| M4 | 0.4 | 0.36 | 156 | 46.9 | 66.6 | 195.7 | 73.8 | 269.5 |
| M5 | 0.32 | 0.32 | 156 | 39.7 | 61.5 | 195.7 | 61.5 | 257.2 |
| M6 | 0.6 | none | 156 | 86.0 | none | 195.7 | 46.3 | 242.0 |
| M7 | 0.56 | none | 156 | 73. | none | 195.7 | 34.0 | 229.7 |
| M8 | 0.52 | none | 156 | 64.5 | none | 195.7 | 24.8 | 220.5 |
| M9 | 0.46 | none | 156 | 54.3 | none | 195.7 | 14.6 | 210.3 |
| M10 | 0.36 | none | 156 | 43.0 | none | 195.7 | 3.3 | 199.0 |
| M11 | 0.32 | none | 156 | 39.7 | none | 195.7 | 0.0 | 195.7 |
| M12 | 0.32 | none | 156 | 39.7 | none | 195.7 | 0.0 | 195.7 |
| M13 | 0.32 | none | 156 | 39.7 | none | 195.7 | 0.0 | 195.7 |
| MN | 0.32 | none | 156 | 39.7 | none | 195.7 | 0.0 | 195.7 |

*FIG. 13*

VOLTAGE EQUALIZATION FOR STACKED FETS IN RF SWITCHES

RELATED APPLICATIONS

This application claims the benefit of provisional patent application Ser. No. 61/371,809, filed Aug. 9, 2010, the disclosure of which is hereby incorporated herein by reference in its entirety.

FIELD OF THE DISCLOSURE

The present disclosure relates to a radio frequency (RF) switch used for wireless communication, and in particular to providing voltage equalization for a series stack of transistors making up a switch branch of the RF switch.

BACKGROUND

High power radio frequency (RF) switches typically include at least one switch branch made up of a series stack of transistors that distribute a relatively high RF voltage to prevent transistor breakdown within the series stack of transistors. However, parasitic capacitances from the series stack of transistors to ground or to a wafer substrate create non-uniformities in the voltage distribution while the at least one switch branch is in an off mode and blocking an RF signal. As a result, more transistors must be included in the series stack of transistors in order to withstand the relatively high RF voltage. Adding more transistors to the series stack of transistors increases the area taken up by the at least one switch branch. Moreover, these additional transistors increase an insertion loss for the at least one switch branch made up of the series stack of transistors. Thus, there is a need for a switch branch that more uniformly distributes a relatively high RF voltage across the series stack of transistors so that the number of transistors making up the series stack of transistors can be reduced without risking a transistor breakdown within the series stack of transistors.

SUMMARY

The present disclosure provides a switch branch that more uniformly distributes a relatively high RF voltage across a series stack of transistors so that the number of transistors making up the series stack of transistors can be reduced without risking a transistor breakdown within the series stack of transistors. In particular, the present disclosure provides a switch branch that includes an input terminal, an output terminal, and a series stack of an n-number of transistors, wherein a first one of the n-number of transistors is coupled to the input terminal, and an nth one of the n-number of transistors is coupled to the output terminal, where n is a positive integer greater than one. Parasitic capacitances are associated with each of the n-number of transistors. At least one metal layer element is dimensioned and arranged in proximity to the series stack of the n-number of transistors to modify capacitance values of predetermined ones of the parasitic capacitances by predetermined amounts. An iterative method incorporating a computer simulation of operational conditions for the switch branch is provided to predetermine capacitance values for the predetermined ones of the parasitic capacitances needed to more uniformly distribute the relatively high RF voltage to be withstood by the switch branch.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 10 is a table that lists capacitance values for the total drain to source capacitance for each of the transistors of FIG. 9.

FIG. 13 is a table that provides the first metal layer and second metal layer metal stripe widths X for a metal stripe layout like that depicted in FIG. 5.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
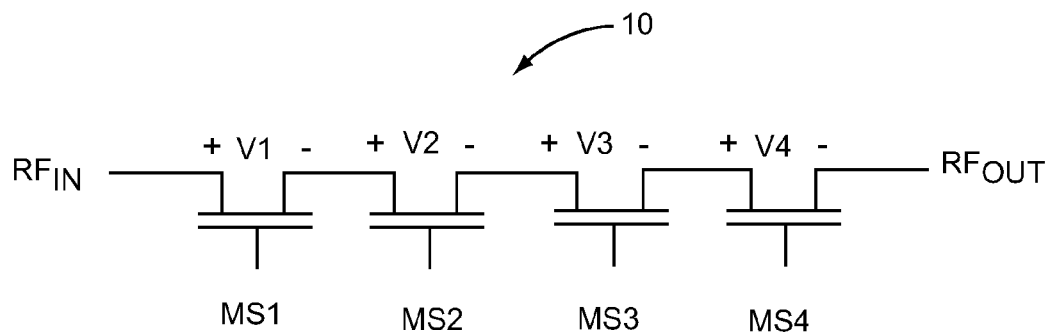
FIG. 1 is a circuit diagram of a prior art switch branch having a non-uniform distribution of voltage.

FIG. 1 is a circuit diagram of a prior art switch branch 10 having a non-uniform distribution of voltage while the switch branch 10 is in an off-mode blocking a signal transmission between a radio frequency (RF) input $RF_{IN}$ and an RF output $RF_{OUT}$. The switch branch 10 is made up of a series stack of transistors MS1, MS2, MS3, and MS4, each of which is a field effect transistor (FET). Drain to source voltages V1, V2, V3, and V4 across the transistors MS1, MS2, MS3, and MS4 are not uniformly distributed in that the voltage values are different from one another. Therefore, one of the transistors MS1 through MS4 will experience a minimum drain to source voltage, while another one of the transistors MS1 through MS4 will experience a maximum drain to source voltage.

Figure 2:
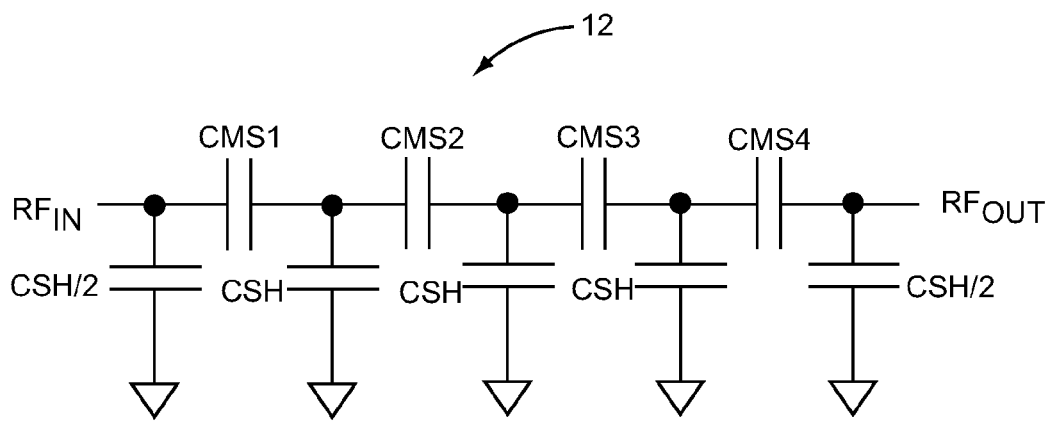
FIG. 2 is a circuit diagram representing an off-state circuit model of the prior art switch branch of FIG. 1.

FIG. 2 is a circuit diagram representing an off-state circuit model 12 of the prior art switch branch 10 of FIG. 1. In an off-state, the transistors MS1, MS2, MS3, and MS4 can be represented by parasitic capacitors CMS1, CMS2, CMS3, and CMS4, respectively. Parasitic shunt capacitance CSH represents the value for the parasitic capacitances between the drain and source of each of the transistors MS1 through MS4 and ground or a wafer substrate onto which the transistors MS1 through MS4 are fabricated.

Figure 3:
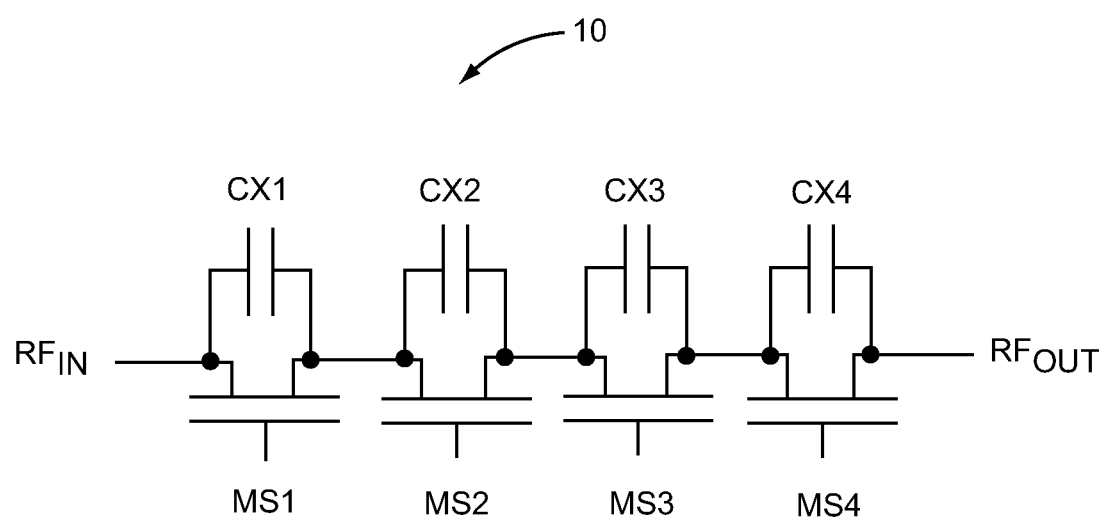
FIG. 3 is a circuit diagram of the prior art switch branch of FIG. 1 including traditional capacitor compensation for improving voltage distribution.

FIG. 3 is a circuit diagram of the prior art switch branch 10 further including a traditional capacitor compensation technique for improving the voltage distribution across the switch branch 10. Compensation capacitors CX1, CX2, CX3, and CX4 are coupled directly to each respective transistor MS1, MS2, MS3, and MS4. Each of the capacitors is sized to provide enough additional capacitance to the parasitic capacitors CMS1 through CMS4 (FIG. 2) so that the drain to source voltages V1 through V4 are more equal to one another, to provide a more uniform voltage distribution across the switch branch 10. However, this traditional capacitor compensation technique is less than ideal because the compensation capacitors undesirably increase the area of the switch branch 10.

Another traditional technique used to reduce the drain to source voltage of any one of the transistors MS1 through MS4 is to include additional transistors (not shown) in the series stack of transistors making up the switch branch 10. In this way, individual ones of the transistors MS1 through MS4 and the additional transistors are ensured not to experience enough drain to source voltage to break down. However, including additional transistors in the series stack of transistors making up the switch branch 10 is not ideal because the additional transistors increase the area taken up by the switch branch 10. Moreover, these additional transistors increase an insertion loss for the switch branch 10.

Figure 4:
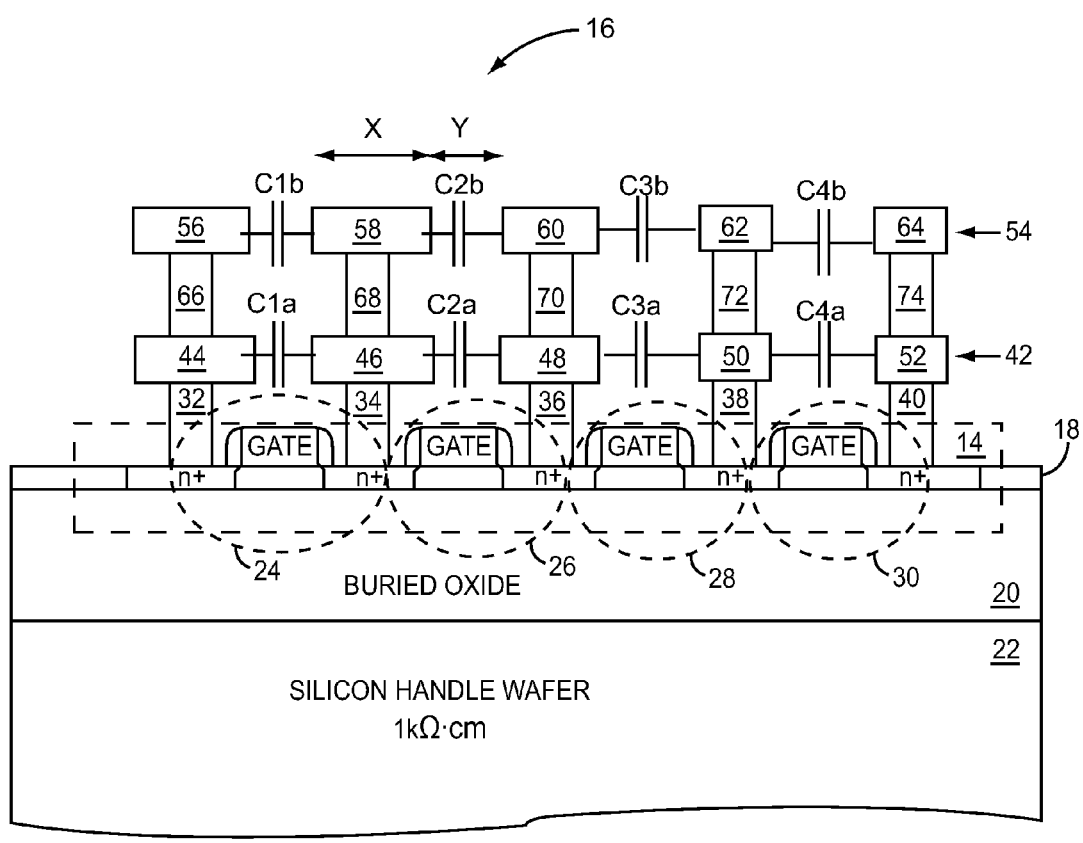
FIG. 4 is a cross-section of a series stack of transistors having first and second metal parallel connections between parallel metal stripes.

Beginning with FIG. 4, the present disclosure provides structures and methods for new integrated circuit layout practices that improve the uniformity of voltage distribution across a series stack of transistors 14. As shown in FIG. 4, the series stack of transistors 14 makes up a first embodiment of an improved switch branch 16. The series stack of transistors 14 is typically formed in an active device layer 18 by a process of wafer bonding followed by cleaving and polishing. The active device layer is on top of a buried oxide layer 20 that insulates the active device layer 18 from a silicon handle wafer 22.

A first FET 24, a second FET 26, a third FET 28, and a fourth FET 30 make up the series stack of transistors 14. A first contact 32 is coupled to the drain of the first FET 24. The first contact 32 is usable as an input or an output for the series stack of transistors 14. A second contact 34 is coupled to the source of the first FET 24, and to the drain of the second FET 26. A third contact 36 is coupled to the source of the second FET 26, and to the drain of the third FET 28. A fourth contact 38 is coupled to the source of the third FET 28, and to the drain of the fourth FET 30. A fifth contact 40 is coupled to the source of the fourth FET 30. The fifth contact 40 is usable as an input or as an output for the series stack of transistors 14. A first metal layer 42 includes a metal stripe 44 coupled to the first contact 32, a metal stripe 46 coupled to the second contact 34, a metal stripe 48 coupled to the third contact 36, a metal stripe 50 coupled to the fourth contact 38, and a metal stripe 52 coupled to the fifth contact 40.

In modern silicon-on-insulator (SOI) complementary metal oxide semiconductor (CMOS) processes, a gate pitch for the FETS 24 through 30 is 1 µm or less. Therefore, a significant portion of a total drain to source capacitance (Cds) is attributable to a parasitic capacitor coupled between adjacent metal stripes, such as the metal stripe 44 and the metal stripe 46. In FIG. 4, a parasitic capacitor C1a is shown symbolically coupled between the metal stripe 44 and the metal stripe 46. A parasitic capacitor C2a is shown symbolically coupled between the metal stripe 46 and the metal stripe 48. Similarly, a parasitic capacitor C3a is shown symbolically coupled between the metal stripe 48 and the metal stripe 50. Likewise, a parasitic capacitor C4a is shown symbolically coupled between the metal stripe 50 and the metal stripe 52.

A second metal layer 54 includes metal stripes 56, 58, 60, 62, and 64. The metal stripe 56 is coupled to the metal stripe 44 through a via 66, and the metal stripe 58 is coupled to the metal stripe 46 through a via 68. The metal stripe 60 is coupled to the metal strip 48 through a via 70. The metal stripe 62 is coupled to the metal stripe 50 through a via 72, and the metal stripe 64 is coupled to the metal stripe 52 through a via 74. A parasitic capacitor C1b is shown symbolically coupled between the metal stripe 56 and the metal stripe 58. A parasitic capacitor C2b is shown symbolically coupled between the metal stripe 58 and the metal stripe 60. Similarly, a parasitic capacitor C3b is shown symbolically coupled between the metal stripe 60 and the metal stripe 62. Likewise, a parasitic capacitor C4b is shown symbolically coupled between the metal stripe 62 and the metal stripe 64.

The width of each of the metal stripes 44 through 64 is represented by a variable X, and the space between adjacent ones of the metal stripes 44 through 64 is represented by a variable Y. If the variable X is increased for an individual one of the metal stripes 44 through 64, the variable Y for the space separating the individual one of the metal stripes 44 through 64 from at least one of the adjacent ones of the metal stripes 44 through 64 will decrease. As a result, the parasitic capacitance between the individual one of the metal stripes 44 through 64 and at least one of the adjacent ones of the metal stripes 44 through 64 will increase. For example, if the width of the metal stripe 58 is uniformly increased, the space between the metal stripe 58 and the adjacent metal stripes 56 and 60 will decrease. As a result, the parasitic capacitors C1b and C2b respectively will increase in capacitance. In a contrasting example, if the width of the metal stripe 62 is reduced, the space between the adjacent metal stripes 60 and 64 will increase. As a result, the parasitic capacitors C3b and C4b will decrease in capacitance.

Standard metallization design rules of a CMOS technology will limit the minimum width of each of the metal stripes 44 through 64, as well as limit the minimum spacing between adjacent ones of the metal stripes 44 through 64.

For example, a CMOS technology with 0.25 μm minimum feature size will allow a ratio of a maximum metal capacitance Cmax to a minimum metal capacitance Cmin to be on the order of two to four without any change in gate pitch for the FETs 24 through 30. Thus, the total Cds for individual ones of the FETs 24 through 30 can be increased by as much as 50% to 100% from a minimum total Cds, wherein the width of the metal stripes 44 through 64 is minimized.

Adjustments to the capacitance values of parasitic capacitors represented by C1a through C4b can be made by varying the width of the metal stripes 44 through 64. Preferably, the width in the metal stripes 44 through 64 is reduced gradually along the series stack of transistors 14. In this way, the values of the parasitic capacitors represented by C1a through C4b are decreased from higher to lower values of capacitance along the series stack of transistors 14. As such, the drain to source voltages (Vds) for each of the FETs 24 through 30 is more uniformly distributed.

Figure 5:
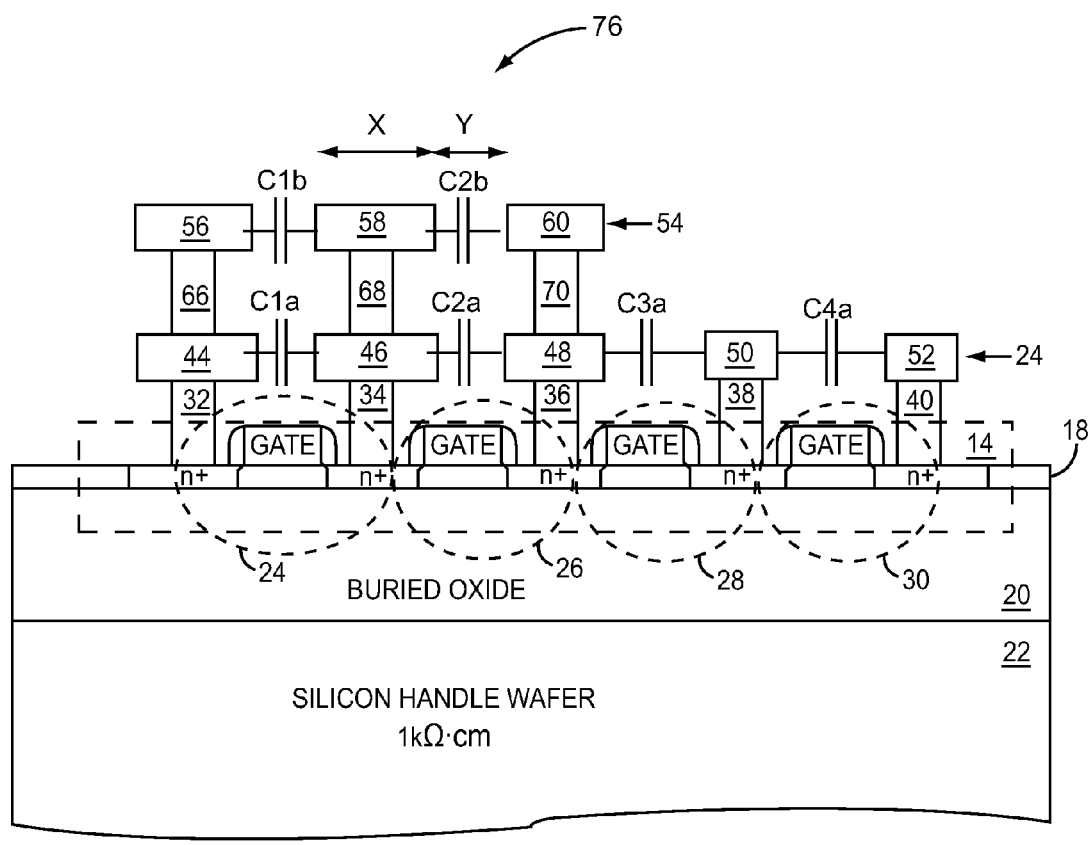
FIG. 5 is a cross-section of the series stack of transistors having first and second metal parallel connections between only selected parallel metal stripes.

FIG. 5 is a cross-section of the series stack of transistors 14 having first and second metal parallel connections between only the metal stripes 44 through 60, which make up a switch branch 76. The metal stripe 62 (FIG. 4) and the metal stripe 64 (FIG. 4) are absent from the switch branch 76. As a result, the parasitic capacitances C3b and C4b shown symbolically in FIG. 4 are absent from the switch branch 76. The absence of the metal stripe 62 and the metal stripe 64 from the switch branch 76 allows for an even greater range of parasitic capacitances represented symbolically as C1b and C2b. It is to be understood that the embodiments of the switch branch 16 (FIG. 4) and the switch branch 76 may include a smaller or greater number of FETs making up the series stack of transistors 14. Moreover, additional metal layers beyond the first metal layer 42 and the second metal layer 54 may be used to adjust the value of the total Cds for each transistor making up the series stack of transistors 14.

Figure 6A:
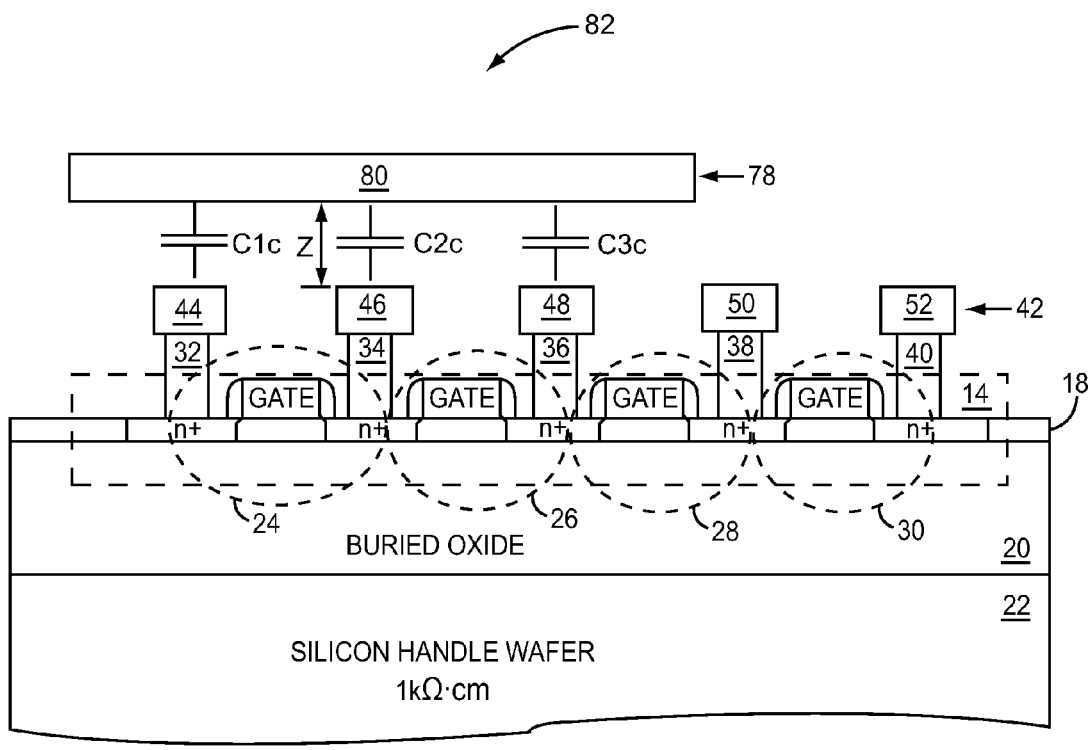
FIG. 6A is a cross-section of the series stack of transistors having a continuous metal stripe within a second metal layer that is separated from the first metal layer by a distance Z.

FIG. 6A is a cross-section of the series stack of transistors 14 having a second metal layer 78 with a continuous metal stripe 80 that is separated from the first metal layer 42 by a distance Z. The series stack of transistors 14 together with the first metal layer 42 and second metal layer 78 comprises a switch branch 82. In the particular case of the switch branch 82, the continuous metal stripe 80 is not directly coupled to the first metal layer 42. Furthermore, the second metal layer 78 is not necessarily associated with the switch branch 82 for purposes other than to adjust the capacitance values of parasitic capacitances shown symbolically as C1c, C2c, and C3c.

The continuous metal stripe 80 may be an element of an adjacent circuitry (not shown), or the continuous metal stripe 80 may be added to the switch branch 82 for the sole purpose of adjusting the parasitic capacitances represented by C1c, C2c, and C3c. Preferably, the distance Z separating the continuous metal stripe 80 is less than about 5 μm so that the parasitic capacitances represented by C1c, C2c, and C3c are adjusted to more uniformly distribute the Vds for each of the FETs 24 through 30.

Figure 6B:
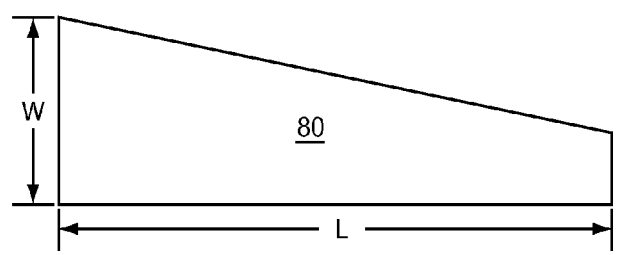
FIG. 6B is a top view of the continuous metal stripe within the second metal layer of FIG. 6A.

As shown in FIG. 6B, the metal stripe 80 has lateral dimensions of a length L and a width W that can be adjusted to further adjust the capacitance values of the parasitic capacitances shown symbolically as C1c, C2c, and C3c.

For example, the width W can be tapered to incrementally decrease the capacitance values of the parasitic capacitances C2c and C3c as the length L of the continuous metal stripe 80 extends along at least a portion of the series stack of transistors 14.

Figure 7:
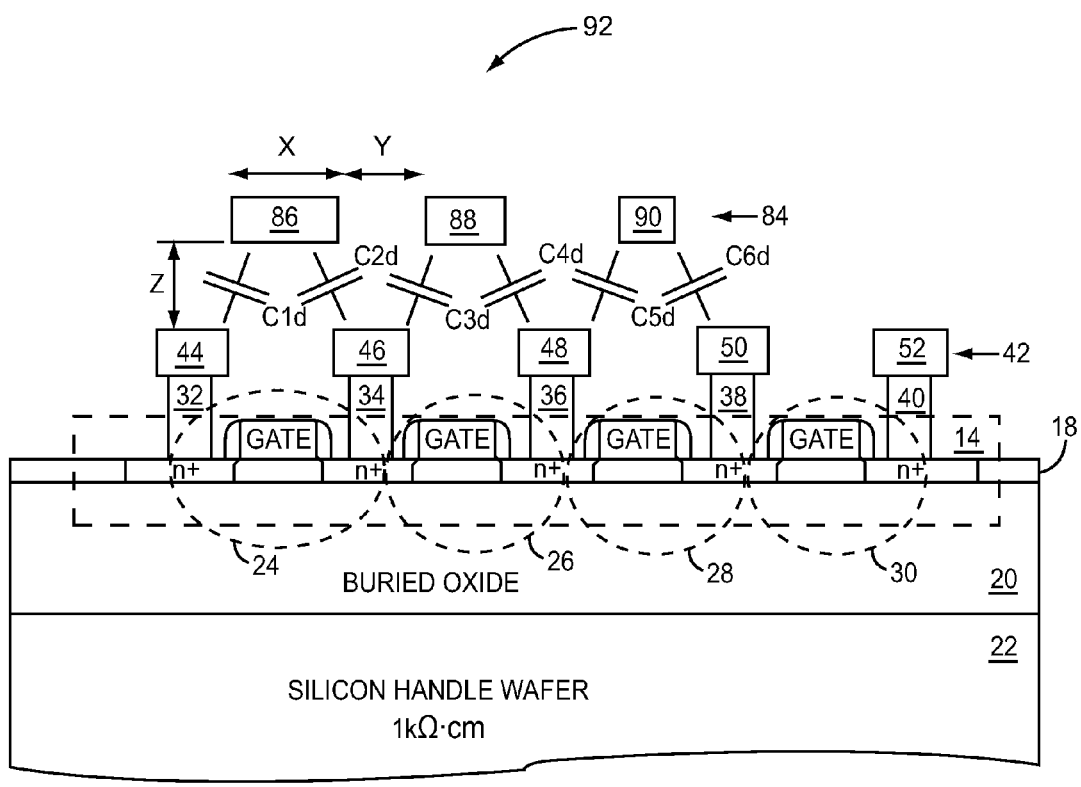
FIG. 7 is a cross-section of the series stack of transistors having a second metal layer with a pattern of metal stripes that is not coupled to the first metal layer.

FIG. 7 is a cross-section of the series stack of transistors 14 having a second metal layer 84 with a pattern of metal stripes 86, 88, and 90 that are located above and separated from the first metal layer 42 by the distance Z. The series stack of transistors 14, together with the first metal layer 42 and second metal layer 84, comprises a switch branch 92. The metal stripe 86 is centered between and above the metal stripes 44 and 46 of the first metal layer 42. A parasitic capacitance symbolically represented by the capacitor C1d is formed between the metal stripe 44 and the metal stripe 46. Likewise, a parasitic capacitance symbolically represented by the capacitor C2d is formed between the metal stripe 46 and the metal stripe 86. The capacitance values for the capacitor C1d and the capacitor C2d are adjusted by altering the width X of the metal stripe 86 and the separation distance Z. Parasitic capacitances symbolically represented by the capacitor C3d and the capacitor C4d are adjusted by altering the width of the metal stripe 88 and/or changing the separation distance Z. Similarly, the parasitic capacitances symbolically represented by the capacitor C5d and the capacitor C6d are adjusted by altering the width of the metal stripe 90 and/or changing the separation distance Z.

Notice, that as shown in FIG. 7, the combined capacitance values for the capacitor C1d and the capacitor C2d will be larger than the combined capacitance values for the capacitor C5d and the capacitor C6d. The combined capacitance values for the capacitor C3d and the capacitor C4d will be less than the combined capacitance values for the capacitor C1d and the capacitor C2d and greater than the combined capacitance values for the capacitor C5d and the capacitor C6d. In this way, the values of the parasitic capacitances represented by C1d through C6d are decreased from higher to lower values of capacitance along the series stack of transistors 14. As such, the Vds for each of the FETs 24 through 30 becomes more uniformly distributed.

In the particular case of the switch branch 92, the metal stripes 86, 88, and 90 are not directly coupled to the first metal layer 42. Furthermore, the second metal layer 84 is not necessarily associated with the switch branch 92 for purposes other than to adjust the capacitance values of parasitic capacitances shown symbolically as the capacitors C1d through C6d.

Figure 8:
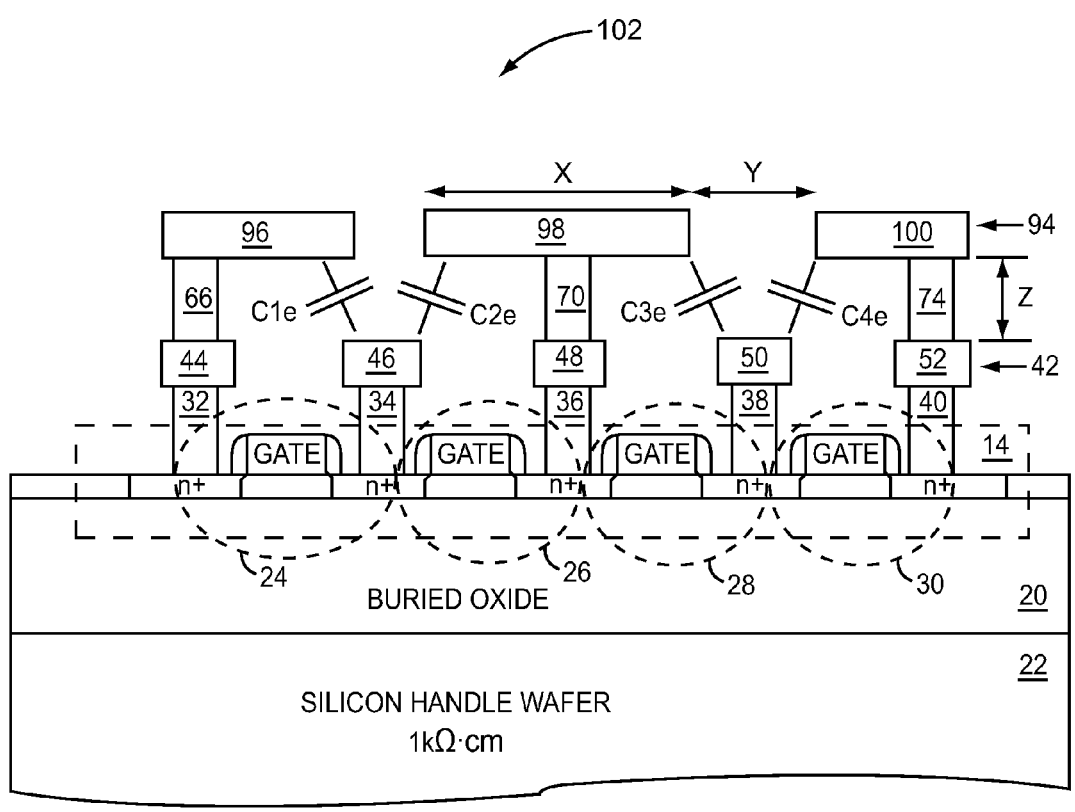
FIG. 8 is a cross-section of the series stack of transistors having a second metal layer with a pattern of metal stripes that is coupled to the first metal layer in an alternating fashion.

FIG. 8 is a cross-section of the series stack of transistors 14 having a second metal layer 94 with a pattern of metal stripes 96, 98, and 100 that are coupled to the first metal layer 42 in an alternating fashion. The series stack of transistors 14 together with the first metal layer 42 and the second metal layer 94 makes up a switch branch 102. The metal stripe 96 is directly coupled to the metal stripe 44 through the via 66. The width X of the metal stripe 96 is modified to adjust a parasitic capacitance formed between the metal stripe 96 and the metal stripe 46 and is represented symbolically by a capacitor C1e. The metal stripe 98 is directly coupled to the metal stripe 48 through the via 70. The width X of the metal stripe 98 is modified to adjust a parasitic capacitance formed between the metal stripe 46 and the metal stripe 98, and is represented symbolically by a capacitor C2e. The width X of the metal stripe 98 is also modified to adjust a parasitic capacitance formed between the metal stripe 50 and the metal stripe 98, and is represented symbolically by a capacitor C3e. The metal stripe 100 is directly coupled to the metal stripe 52 through the via 74. The width X of the metal stripe 100 is modified to adjust a parasitic capacitance formed between the metal stripe 50 and the metal stripe 100, and is represented symbolically by a capacitor C4e. The Vds for each of the FETs 24 through 30 is made more uniformly distributed by adjusting the parasitic capacitances represented symbolically by the capacitors C1e through C4e.

Figure 9:
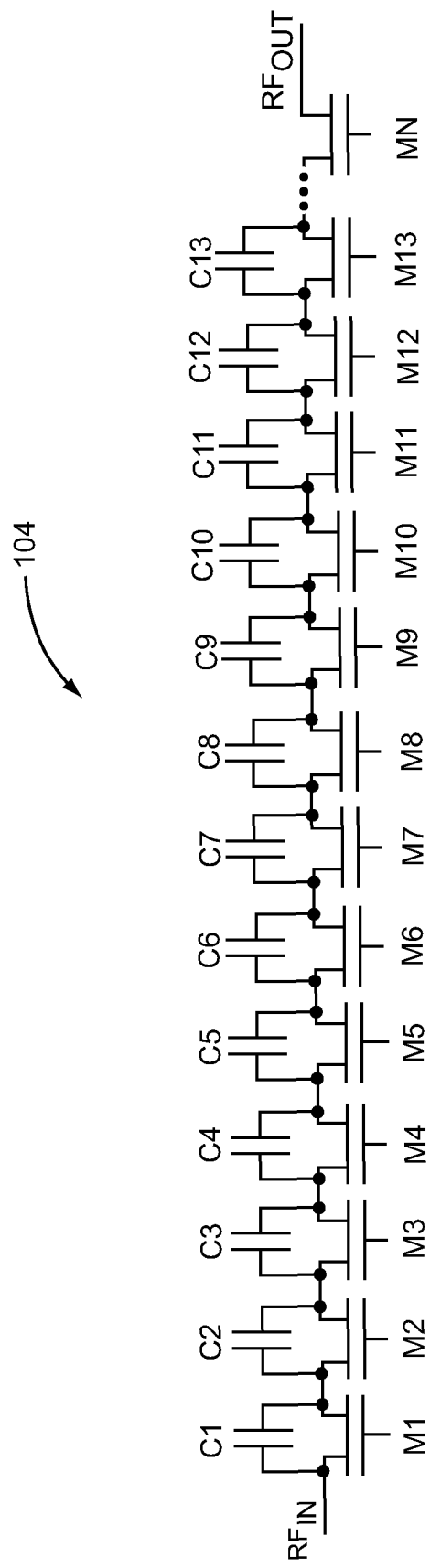
FIG. 9 is a circuit diagram of a switch branch that is usable to test the effectiveness of the metal stripe layouts of FIGS. 4 through 8 in uniformly distributing a voltage across the series stack of transistors.

FIG. 9 is a circuit diagram of a switch branch 104 that is usable to test the effectiveness of the metal stripe layouts of FIGS. 4 through 8 in uniformly distributing voltages across a series stack of transistors, such as FETs M1 through an nth FET MN. An $RF_{IN}$ is coupled to the drain of the FET M1, whereas an $RF_{OUT}$ is coupled to the source of MN. The total drain to source capacitance for each of the FETs M1 through MN is represented symbolically by the capacitors C1 through C13. FIG. 10 is a table of capacitance values for the capacitors C1 through C13 for each of the transistors M1 through MN of FIG. 9. Preferred values for the parasitic capacitances for the various metal stripe layouts depicted in FIGS. 4 through 8 can be derived from the table of capacitance values listed in FIG. 10. Further still, a preferred width X and or separation distance Z for each of the metal stripes depicted in FIGS. 4 through 8 can be derived from the preferred parasitic capacitance values.

Figure 11:
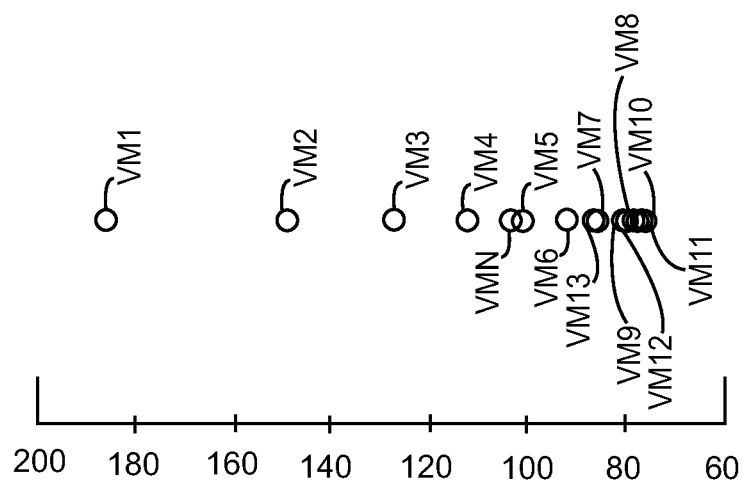
FIG. 11 depicts results of a simulation for the switch branch of FIG. 9 without application of the capacitance values of the table of FIG. 10.

FIG. 11 is a one-dimensional graph depicting normalized maximum AC voltages (VM1 through VMN) from drain to source for each of the FETs M1 through MN without including the preferred capacitance values for the capacitors C1 through C13. For example, the voltage VM1 represents the normalized maximum voltage across the FET M1. A normalized voltage value of 100 indicates an expected maximum AC voltage for uniform (i.e., equal) voltages across each of the FETs M1 through MN. Notice that due to no adjustments being made to the parasitic capacitances, the voltages across each of the FETs M1 through M3 (FIG. 9) near the $RF_{IN}$ range as much as 85% higher than uniform voltages for the FETs M1 through MN. In contrast, the FETs M12 through MN (FIG. 9) near the $RF_{OUT}$ range as much as 25% lower than uniform voltages for the FETs M1 through MN.

Figure 12:
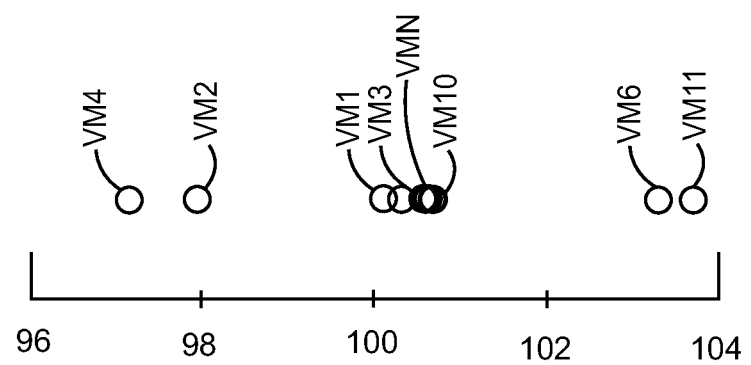
FIG. 12 depicts results of a simulation for the switch branch of FIG. 9 with the application of the capacitance values of the table of FIG. 10.

FIG. 12 is a one-dimensional graph depicting VM1 through VMN from drain to source for each of the FETs M1 through MN, wherein the preferred capacitance values for the capacitors C1 through C13 are included. Notice that with appropriate adjustments to the parasitic capacitances, the voltages across each of the FETs M1 through M3 (FIG. 9) near the $RF_{IN}$ only range about 4% higher than exactly uniform voltages for the FETs M1 through MN. Moreover, the FETs M12 through MN (FIG. 9) near the $RF_{OUT}$ only range about 2% lower than exactly uniform voltages for the FETs M1 through MN. Therefore, the metal stripe layouts of FIGS. 4 through 8 greatly improve the uniformity of voltages from drain to source for each of the FETs M1 through MN. FIG. 13 is a table that provides the first metal layer and second metal layer metal stripe widths X for a metal stripe layout similar to that depicted in FIG. 5.

Figure 14:
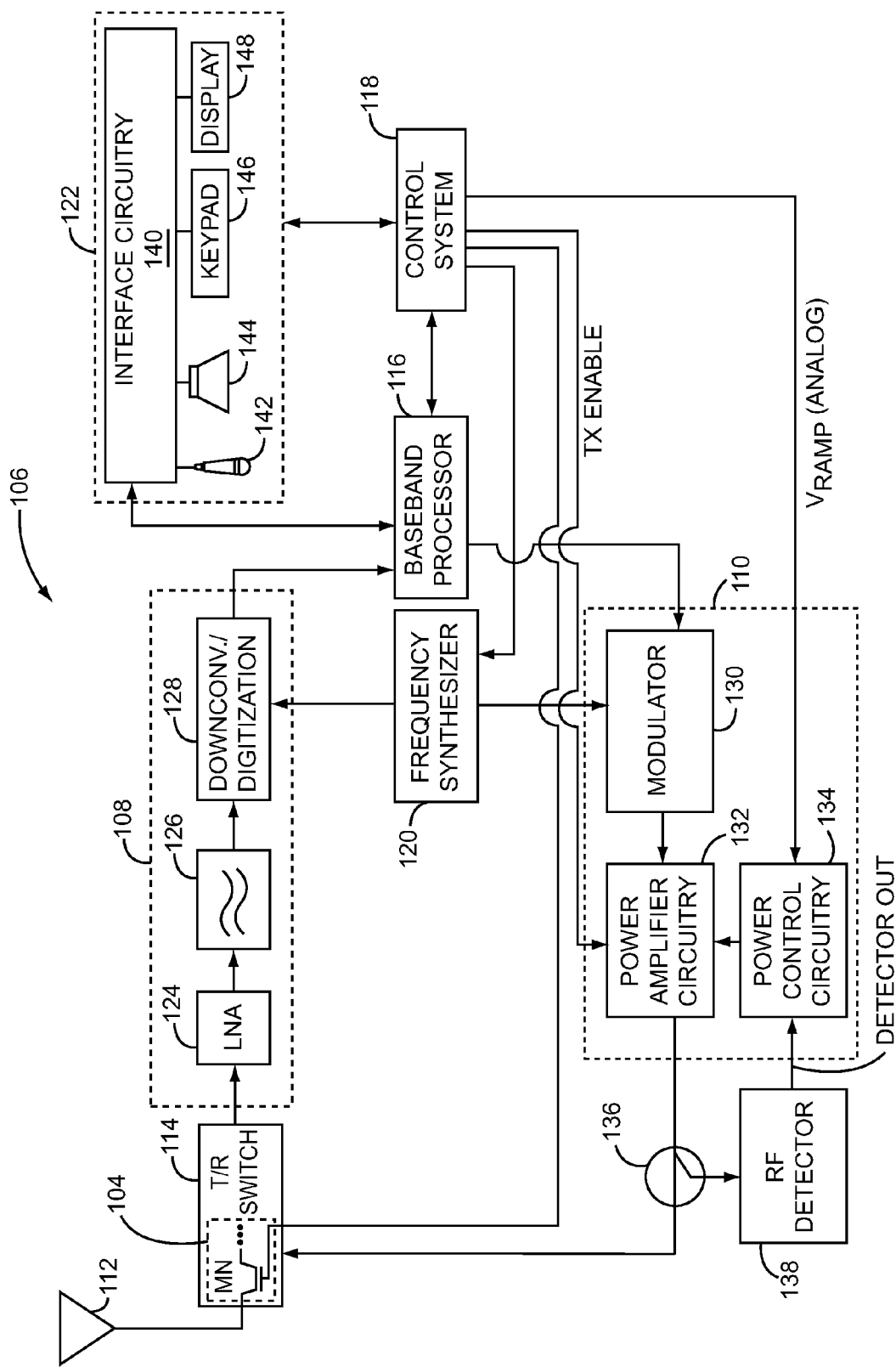
FIG. 14 is a block diagram of a mobile terminal that includes a parasitic capacitance adjusted switch branch that is in accordance with the present disclosure.

The switch branch 104 of the present disclosure is preferably incorporated in a mobile terminal 106, such as a mobile telephone, personal digital assistant (PDA), personal computer, or the like. The basic architecture of the mobile terminal 106 is represented in FIG. 14, and may include a receiver front end 108, an RF transmitter section 110, an antenna 112, a transmit/receive (T/R) switch 114 that includes one or more of the switch branch 104, a baseband processor 116, a control system 118, a frequency synthesizer 120, and an interface 122.

The receiver front end 108 receives information-bearing RF signals from one or more remote transmitters provided by a base station (not shown). A low noise amplifier 124 amplifies the RF signal. A filter circuit 126 minimizes broadband interference in the RF signal, while a downconverter 128 downconverts the filtered, received RF signal to an intermediate or baseband frequency signal, which is then digitized into one or more digital streams. The receiver front end 108 typically uses one or more mixing frequencies generated by the frequency synthesizer 120.

The baseband processor 116 processes the digitized received signal to extract the information or data bits conveyed in the received signal. This processing typically comprises demodulation, decoding, and error correction operations. As such, the baseband processor 116 is generally implemented in one or more digital signal processors (DSPs).

On the transmit side, the baseband processor 116 receives digitized data from the control system 118, which it encodes for transmission. The encoded data is output to the radio frequency transmitter section 110, where it is used by a modulator 130 to modulate a carrier signal that is at a desired transmit frequency. Power amplifier (PA) circuitry 132 amplifies the modulated carrier signal to a level appropriate for transmission from the antenna 112. In an on-state, the switch branch 104 transfers signal power to the antenna 112. In an off-state, the switch branch 104 blocks RF signals. The PA circuitry 132 provides gain for the signal to be transmitted under control of power control circuitry 134, which is preferably controlled by the control system 118 using an adjustable power control signal ($V_{RAMP}$). Further still, a directional coupler 136 samples output power from the PA circuitry 132 and provides a small sample of the output power to the RF detector 138, which in turn provides the DETECTOR OUT signal to the power control circuitry 134.

In response to the RF detector 138 providing the DETECTOR OUT signal to the power control circuitry 134, the bias for the PA circuitry 132 is adjusted to maintain a desired output power under varying conditions, such as decreasing battery voltage and/or fluctuating voltage standing wave ratio (VSWR), etc. The control system 118 may also provide a transmit enable signal (TX ENABLE) to effectively enable the PA circuitry 132 during periods of transmission.

A user may interact with the mobile terminal 106 via the interface 122, which may include interface circuitry 140 associated with a microphone 142, a speaker 144, a keypad 146, and a display 148. The interface circuitry 140 typically includes analog-to-digital converters, digital-to-analog converters, amplifiers, and the like. Additionally, the interface circuitry 140 may include a voice encoder/decoder, in which case it may communicate directly with the baseband processor 116.

The microphone 142 will typically convert audio input, such as the user's voice, into an electrical signal, which is then digitized and passed directly or indirectly to the baseband processor 116. Audio information encoded in the received signal is recovered by the baseband processor 116 and converted into an analog signal suitable for driving the speaker 144 and the interface circuitry 140. The keypad 146 and the display 148 enable the user to interact with the mobile terminal 106, inputting numbers to be dialed, address book information, or the like, as well as monitoring call progress information.

Those skilled in the art will recognize improvements and modifications to the preferred embodiments of the present disclosure. All such improvements and modifications are considered within the scope of the concepts disclosed herein and the claims that follow.

What is claimed is:

1. A switch branch, comprising:
   an input terminal, an output terminal, and a series stack of N transistors in a first plane, wherein N is a positive number greater than one and a first one of the N transistors is coupled to the input terminal, and an Nth one of the N transistors is coupled to the output terminal;
   N+1 metal stripes that reside in and are spaced apart from each other in a second plane that is parallel with and above the first plane; and
   at least one metal stripe in a third plane that is parallel with and above the second plane, wherein the at least one metal stripe and the N+1 metal stripes are sized and spaced apart from each other to set parasitic drain to source capacitances associated with each of the N transistors such that a voltage drop across each of the N transistors ranges no more than 4% higher to no more that 2% lower than exactly uniform drain to source voltages across each of the N transistors.

2. The switch branch of claim 1 wherein the spacing between a first pair of N+1 metal stripes and a second pair of N+1 metal stripes is different.

3. The switch branch of claim 2 wherein the size of a first of the N+1 metal stripes and a second of the N+1 metal stripes is different.

4. The switch branch of claim 3 wherein the spacing between each of the N transistors is substantially equal.

5. The switch branch of claim 1 wherein the spacing between each of the N transistors is substantially equal.

6. The switch branch of claim 1 wherein the size of a first of the N+1 metal stripes and a second of the N+1 metal stripes is different.

7. The switch branch of claim 1 wherein the at least one metal stripe comprises a plurality of metal stripes in the third plane.

8. The switch branch of claim 7 wherein at least two of the plurality of metal stripes are of different sizes.

9. The switch branch of claim 8 wherein the spacing between a first pair of the plurality of metal stripes and a second pair of the plurality of metal stripes is different.

10. The switch branch of claim 9 wherein the spacing between a first pair of the N+1 metal stripes and a second pair of the N+1 metal stripes is different.

11. The switch branch of claim 10 wherein the size of a first of the N+1 metal stripes and a second of the N+1 metal stripes is different.

12. The switch branch of claim 11 wherein the spacing between each of the N transistors is substantially equal.

13. A method of fabricating a switch branch, comprising:
    fabricating a series stack of N transistors in a first plane, wherein N is a positive number greater than one and a first one of the N transistors is coupled to an input terminal, and an Nth one of the N transistors is coupled to an output terminal;
    fabricating N+1 metal stripes that reside in and are spaced apart from each other in a second plane that is parallel with and above the first plane; and
    fabricating at least one metal stripe in a third plane that is parallel with and above the second plane, wherein the at least one metal stripe and the N+1 metal stripes are sized and spaced apart from each other to set parasitic drain to source capacitances associated with each of the N transistors such that a voltage drop across each of the N transistors ranges no more than 4% higher to no more that 2% lower than exactly uniform drain to source voltages across each of the N transistors.

14. The method of fabricating the switch branch of claim 13 wherein the spacing between a first pair of the N+1 metal stripes and a second pair of the N+1 metal stripes is different.

15. The method of fabricating the switch branch of claim 14 wherein the size of a first of the N+1 metal stripes and a second of the N+1 metal stripes is different.

16. The method of fabricating the switch branch of claim 15 wherein the spacing between each of the N transistors is substantially equal.

17. The method of fabricating the switch branch of claim 13 wherein the spacing between each of the N transistors is substantially equal.

18. The method of fabricating the switch branch of claim 13 wherein the size of a first of the N+1 metal stripes and a second of the N+1 metal stripes is different.

19. The method of fabricating the switch branch of claim 13 wherein the at least one metal stripe comprises a plurality of metal stripes in the third plane.

20. The method of fabricating the switch branch of claim 19 wherein at least two of the plurality of metal stripes are of different sizes.

21. The method of fabricating the switch branch of claim 20 wherein the spacing between a first pair of the plurality of metal stripes and a second pair of the plurality of metal stripes is different.

22. The method of fabricating the switch branch of claim 21 wherein the spacing between a first pair of N+1 metal stripes and a second pair of N+1 metal stripes is different.

23. The method of fabricating the switch branch of claim 22 wherein the size of a first of the N+1 metal stripes and a second of the N+1 metal stripes is different.

24. The method of fabricating the switch branch of claim 23 wherein the spacing between each of the N transistors is substantially equal.

* * * * *